United States Patent
Kahler et al.

(10) Patent No.: US 7,115,501 B2
(45) Date of Patent: Oct. 3, 2006

(54) METHOD FOR FABRICATING AN INTEGRATED CIRCUIT DEVICE WITH THROUGH-PLATING ELEMENTS AND TERMINAL UNITS

(75) Inventors: Uwe Kahler, Dresden (DE); Dirk Offenberg, Kleve-Kellen (DE)

(73) Assignee: Infineon Technologies AG, Munich (DE)

( * ) Notice: Subject to any disclaimer, the term of this patent is extended or adjusted under 35 U.S.C. 154(b) by 204 days.

(21) Appl. No.: 10/937,903

(22) Filed: Sep. 10, 2004

(65) Prior Publication Data
US 2005/0073046 A1    Apr. 7, 2005

(30) Foreign Application Priority Data
Sep. 12, 2003  (DE) ............................... 103 42 547

(51) Int. Cl.
*H01L 21/4763* (2006.01)

(52) U.S. Cl. ............... 438/642; 438/763; 257/E21.279; 257/E21.576; 257/E23.167

(58) Field of Classification Search ................ 438/642, 438/763; 257/E21.279, E21.576, E23.167
See application file for complete search history.

(56) References Cited

U.S. PATENT DOCUMENTS

| 5,175,122 A | 12/1992 | Wang et al. |
| 5,893,748 A | 4/1999 | Lin |
| 6,034,439 A | 3/2000 | Teng et al. |
| 6,060,348 A | 5/2000 | Yang et al. |
| 6,093,637 A * | 7/2000 | Kishimoto et al. ......... 438/624 |
| 2002/0182886 A1* | 12/2002 | Spinner et al. ............. 438/763 |
| 2003/0102475 A1 | 6/2003 | Kwon et al. |

FOREIGN PATENT DOCUMENTS

DE    42 32 621 C1    3/1994

\* cited by examiner

*Primary Examiner*—Fernando L. Toledo
(74) *Attorney, Agent, or Firm*—Morrison & Foerster LLP

(57) ABSTRACT

A method for fabricating an integrated circuit device, an electrically conductive substrate being provided, an insulation layer being deposited on the substrate, the insulation layer being etched in structures, a contact-making layer being deposited on the patterned insulation layer and on the substrate in depressions which have first and second lateral dimensions, the contact-making layer being etched back in such a way that the contact-making layer is preserved in the structures with the depressions which have first lateral dimensions of the order of magnitude of the structure depth of the insulation layer and the contact-making layer is removed in the structures with depressions which have second lateral dimensions significantly greater than the structure depth of the insulation layer.

13 Claims, 4 Drawing Sheets

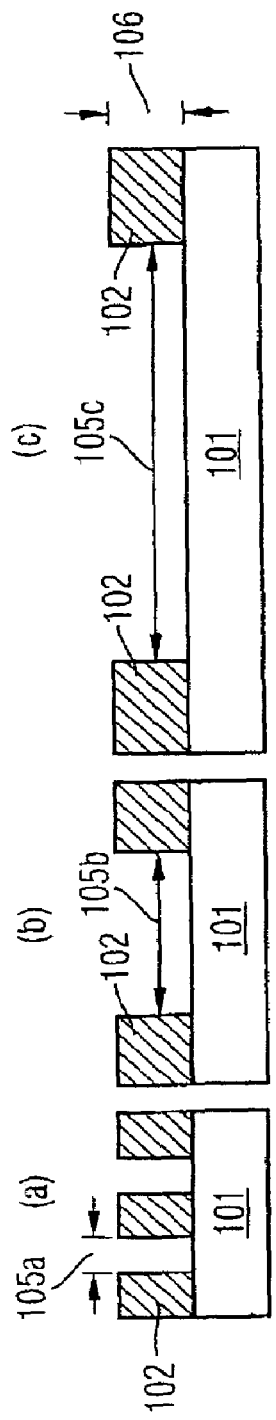
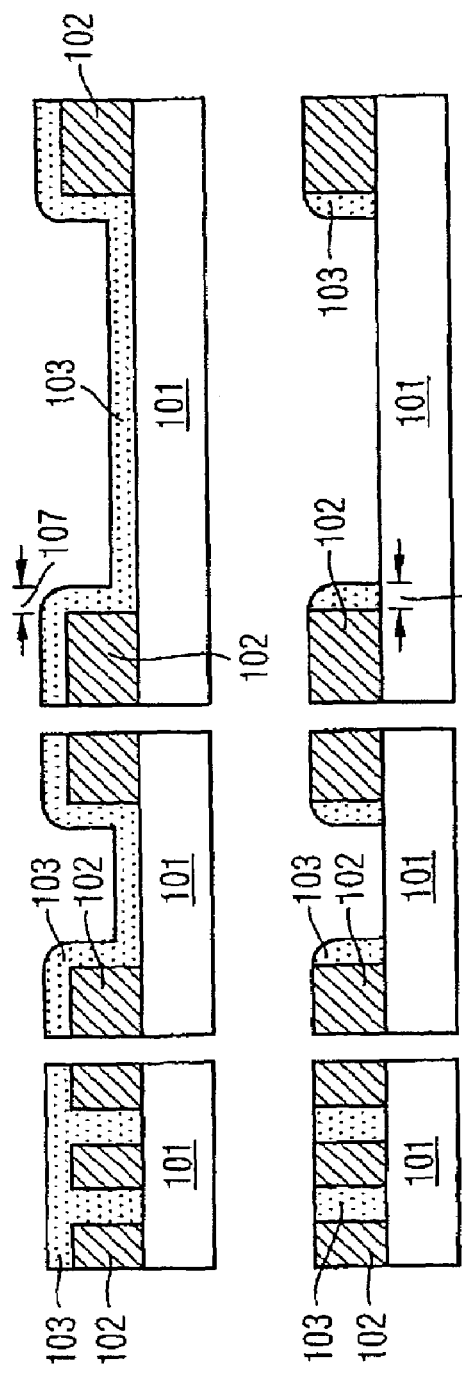
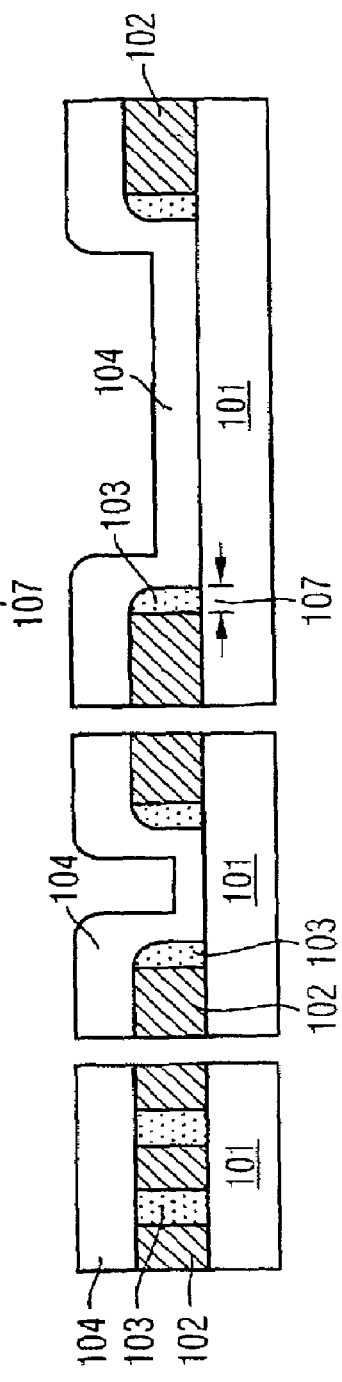
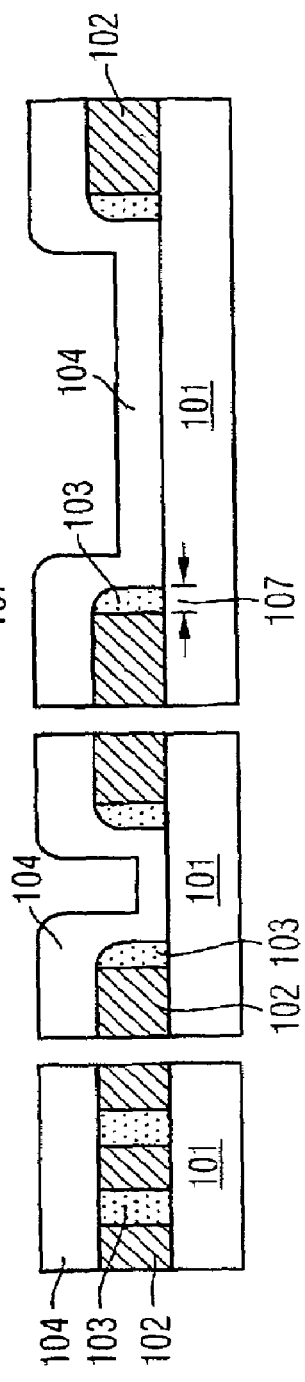
FIG 1A
FIG 1B
FIG 1C
FIG 1D

US 7,115,501 B2

METHOD FOR FABRICATING AN INTEGRATED CIRCUIT DEVICE WITH THROUGH-PLATING ELEMENTS AND TERMINAL UNITS

CLAIM FOR PRIORITY

This application claims the benefit of priority to German Application No. 103 42 547.0, filed on Sep. 12, 2003, the entire contents of which are hereby incorporated by reference.

TECHNICAL FIELD OF THE INVENTION

The present invention relates to fabrication methods for integrated circuit devices, and in particular to a method for fabricating integrated circuit units in which a wiring is effected in a plurality of metal planes.

BACKGROUND OF THE INVENTION

Metal planes, which are also referred to as metal layers, are electrically interconnected by means of so-called through-plating elements also referred to as via contacts.

In addition to customary via contacts or through-plating elements, so-called high-power through-plating elements are also of importance in integrated circuit technology in order to be able to recognize applications which require a high current-carrying capacity.

Furthermore, high-power through-plating elements provide a low-impedance transition between different metal planes. Low-impedance contact-making is required in particular for electrically connecting a final to a penultimate metal plane or metal layer. Preferably in a process sequence terminal units for connecting external circuit units are formed together with through-plating elements and accommodated in a housing of an integrated circuit device.

An essential problem in the fabrication of through-plating elements, high-power through-plating elements and terminal units in a single process sequence is that the through-plating elements, the high-power through-plating elements and the terminal units have structure sizes that differ considerably. However, it is necessary for cost reasons that no additional processes or even additional process levels must be with respect to a process sequence or in a process sequence. In particular the abovementioned problem arises in the context of increasing miniaturization in future technology generations.

Conventional fabrication technologies produce through-plating elements, high-power through-plating elements and terminal units by means of hot aluminum sputtering (aluminum reflow). In the context of a required decrease in size (miniaturization requirement) of the through-plating elements, this process, in a disadvantageous manner, no longer operates viably for future technology generations.

FIG. 2 shows two process steps of a conventional method for fabricating through-plating elements (a), high-power through-plating elements (b) and terminal units (c).

Process step (A) shows how an insulation layer 102 is applied on a substrate 101, the structures of the applied insulation layer 102 having different lateral dimensions. In the case of a conventional filling of the depressions between the structures of the insulation layer 102 and onto the insulation layer 102 by means of a terminal or connecting layer 104 the problem arises that, in the case of small structure sizes and in particular in the case of relatively large structure depths, an unreliable filling of through-plating arrangements arises as indicated by the arrows (I) in FIG. 2.

Consequently, this type of hot aluminum sputtering is suitable for high-power through-plating elements and terminal units of a relatively large lateral dimension in the structure size while the through-plating elements of a smaller structure size that are always present cannot be reliably formed. Furthermore, a disadvantage of the conventional methods for fabricating integrated circuit units is that the hot aluminum sputtering impedes a subsequent lithography step owing to the resultant high degree of roughness of the metal surface in the course of alignment. This is becoming more and more critical, particularly in future technology generations.

In order to solve this problem, it has been proposed to provide the through-plating elements by filling the depressions of the patterned insulation layer 102 with tungsten as shown in FIG. 3, process step (B). The contact-making layer 103 formed from tungsten material then fills all the structures and the corresponding depressions.

Process step (C) shown in FIG. 3 then provides for the contact-making layer 103 to be polished back to a structure size of the insulating layer 102. While the polishing-back process, also referred to as chemical mechanical polishing (CMP), can be carried out satisfactorily in the case of the through-plating elements of a small structure size, as shown in FIG. 3(a), considerable problems arise in the case of the high-power through-plating elements (FIG. 3(b)) and the terminal units (FIG. 3(c)). The disadvantages in the case of the high-power through-plating elements and terminal units consist in the fact that tungsten inexpediently represents a high contact resistance, as shown by an arrow (II) in FIG. 3(b) and an arrow (III) in FIG. 3(c), with the result that the desired current-carrying capacity of the high-power through-plating elements is reduced.

It is furthermore disadvantageous that the terminal units exhibit a so-called "dishing" effect, as shown by an arrow (IV) in FIG. 3(c), i.e. dish-shaped depressions form during the CMP process, the dish-shaped depression, in a disadvantageous manner, not being reproducible, moreover. This results in the disadvantage that the CMP process produces particles that adversely affect the fabrication process of the integrated circuit device. Furthermore, a later bonding by the contact-making layer 104 formed from tungsten material is disturbed (arrow (III) in FIG. 3(c)).

Process step (D) shown in FIG. 3 includes a coating of the structures with which contact is made by tungsten by means of a connecting layer 104 formed, for example, from aluminum. This connecting layer, in a disadvantageous manner, likewise has a "dishing" effect in the case of the high-power through-plating elements and the terminal units, as shown by the arrow (IV) in FIG. 3(c).

In order to solve this problem that occurs as a result of the processing of different structure sizes it has been proposed to provide small structure sizes which are used uniformly for through-plating elements, high-power through-plating elements and terminal units as shown in FIG. 4.

The disadvantage that arises in this case, however, is that the high-power through-plating elements have an impaired current-carrying capacity since a contact-making layer 103 formed from tungsten is used for making contact in the lateral structures (now reduced in size) of the insulation layer 102, as shown by means of an arrow (V) in FIG. 4(b). FIG. 4(c) shows that disadvantages also arise with the terminal units which by means of small structure sizes which correspond to those of the through-plating elements (FIG. 4(a)). These disadvantages consist in the fact that tungsten is once again used for making contact, and impedes a necessary bonding of terminal devices such as wires, for example, to the terminal units of the integrated circuit device, as shown by an arrow (VI) in FIG. 4(c).

Therefore, with the conventional methods shown with reference to FIGS. 2, 3 and 4, it is not possible to achieve a cost-effective and reliable provision of through-plating elements, high-power through-plating elements and terminal units in a uniform process sequence.

SUMMARY OF THE IVENTION

The present invention provides a method for fabricating an integrated circuit device in which, in a uniform process sequence, through-plating elements and terminal units of different lateral structure sizes can be provided reliably and cost-effectively in conjunction with optimal functionality.

In one embodiment of the invention, a polishing-back process is replaced by a chemical mechanical polishing by an etching process and an etching-back process in such a way that a contact-making layer is preserved in the structures with depressions which have small lateral dimensions while the contact-making layer is removed in the structures with depressions which have large lateral dimensions.

One advantage according to the invention is that damage to the integrated circuit device as a result of "dishing" effects does not arise since chemical mechanical polishing is entirely dispensed with.

Furthermore, it is advantageous that high-power through-plating elements and terminal units remain with low impedance since a contact-making layer provided from tungsten is completely removed in the case of high-power through-plating elements and terminal units.

Furthermore, it is advantageous that, in the case of the terminal units, the bonding method is not disturbed owing to the presence of tungsten as a contact-making layer.

In particular, it is expedient that additional lithography steps or other complicated process steps are not necessary. It is advantageous that a process complexity is not increased and, consequently, the fabrication costs are not increased. Furthermore, it is advantageous that an alignment problem in relation to a subsequent lithography is alleviated, since a cold aluminum sputtering process can be used since the through-plating elements are already filled with tungsten and no longer have to be filled by means of a (hot) aluminum sputtering process.

Furthermore, it is expedient that a tungsten etching-back process can be provided simply and cost-effectively.

In on embodiment according to the invention, fabricating an integrated circuit unit includes:
a) providing an electrically conductive substrate;
b) depositing an insulation layer on the substrate;
c) etching the insulation layer in structures which have a structure depth corresponding to a layer thickness of the insulation layer and which have depressions with different first and second lateral dimensions;
d) depositing a contact-making layer on the patterned insulation layer and on the substrate in the depressions, the depression having first lateral dimensions which are less than a layer thickness of the contact-making layer and second lateral dimensions which are significantly greater than the layer thickness;
e) etching back the contact-making layer in such a way that the contact-making layer is preserved in the depressions which have the first lateral dimensions, and the contact-making layer is removed in the depressions which have the second lateral dimensions; and f) depositing a connecting layer (104) on the substrate in the depressions which have the second lateral dimensions on the patterned insulation layer and on the etched-back contact-making layer which is contained in the depressions having the first lateral dimensions.

In accordance with one preferred embodiment, the contact-making layer is deposited in such a way that the depressions which have the first lateral dimensions are filled to a higher level than the depressions which have the second lateral dimensions.

In accordance with one preferred embodiment of the present invention, the substrate is provided as a first metal layer. In accordance with yet another preferred embodiment of the present invention, the insulation layer which is deposited on the substrate is formed as a silicon dioxide layer.

In accordance with yet another preferred embodiment of the present invention, through-plating elements are formed in the structures of the insulation layer which have the depressions with the first lateral dimensions.

In accordance with yet another preferred embodiment of the present invention, high-power through-plating elements having a high current-carrying capacity and/or a smaller spacing are formed in the structures of the insulation layer which have the depressions with the second lateral dimensions.

In accordance with yet another preferred embodiment of the present invention, terminal units that provide for external components to make contact with the integrated circuit device are formed in the structures of the insulation layer which have the depressions with the second lateral dimensions.

In accordance with yet another preferred embodiment of the present invention, the terminal units formed in the structures of the insulation layer which have the depressions with the second lateral dimensions are bonded. Preferably, the terminal units are bonded with terminal wires for electrical connection to external components.

In accordance with yet another preferred embodiment of the present invention, the contact-making layer which is deposited on the patterned insulation layer and on the substrate in the depressions which have the first and second lateral dimensions is provided by a tungsten material (W).

In accordance with yet another preferred embodiment of the present invention, the connecting layer is provided as a second metal layer. The first and second metal layers are preferably provided from the same material. The first and/or second metal layer are preferably provided from an aluminum material applied by means of a cold aluminum sputtering process.

BRIEF DESCRIPTION OF THE DRAWINGS

Exemplary embodiments of the invention are illustrated in the drawings and explained in more detail in the description below.

In the drawings:

FIG. 1 shows a method for fabricating an integrated circuit device with through-plating elements, high-power through-plating elements and terminal units in accordance with a preferred exemplary embodiment of the present invention.

In the figures, identical reference symbols designate identical or functionally identical components or steps.

DETAILED DESCRIPTION OF THE INVENTION

Figure 2A:
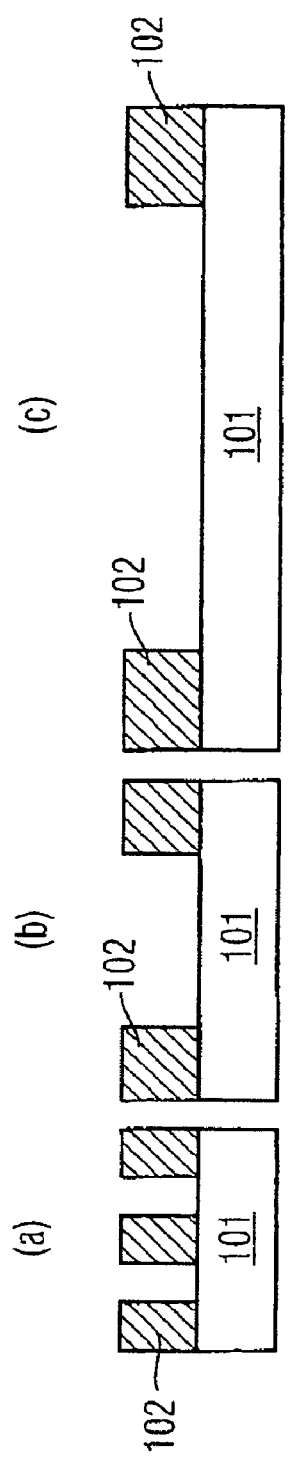
FIG. 2 shows hot aluminum sputtering, in accordance with one conventional method.

FIG. 1 shows an overview of the method according to the invention in four process steps (A), (B), (C) and (D). The process steps relate to the fabrication of through-plating elements as illustrated in FIG. 1(a), of high-power through-plating elements, as shown in FIG. 1(b) in a manner corresponding to the process steps of FIG. 1(a) and the fabrication of terminal units, as shown in FIG. 1(c).

In process step (A), provision is made of a substrate 101, on which an insulation layer 102 is deposited. As shown in FIG. 1, process step (A), the insulation layer 102 is patterned differently, for example by etching.

FIG. 1(a) shows structures for through-plating elements whose lateral dimension 105a is of the order of magnitude of the layer thickness of the insulation layer 102. By contrast, FIGS. 1(b) and 1(c) show structures which have a large lateral dimension 105b, 105c in comparison with the layer thickness, i.e. the depressions of through-plating elements as are shown in FIG. 1(a) have a small lateral extent in comparison with the depressions as are shown in FIG. 1(b) and FIG. 1(c). The structures shown in FIG. 1(b) and FIG. 1(c) are required for fabricating high-power through-plating elements (FIG. 1(b)) and terminal units (FIG. 1(c)). Typical lateral dimensions 105c for lateral dimensions 105c in the case of terminal units are 80 μm.

In a process step (B) a contact-making layer 103 preferably comprising tungsten is deposited onto the structures formed in process step (A). The contact-making layer 103 has a layer thickness 107.

In this case, it should be noted that in process step (A), the insulation layer 102 was etched in structures which have a structure depth 106 corresponding to a layer thickness of the insulation layer 102 and which have depressions with different first and second lateral dimensions 105a, 105b and 105c, respectively. Consequently, process step (B) provides a deposition of the contact-making layer 103 on the patterned insulating layer 102 and on the substrate 101 in the depressions which have the first and second lateral dimensions 105a, 105b and 105c. The said contact-making layer 103 is illustrated by a dark highlighted region in FIGS. 1(a) to 1(c).

According to the invention, the first lateral dimensions 105a are less than twice the layer thickness 107 of the contact-making layer 103. This means that the layer thickness 107 of the contact-making layer 103 has to be chosen such that it corresponds to at least twice the lateral dimensions 105a, so that it can be ensured that the depressions are completely filled by the contact-making layer 103 on account of the smaller first lateral dimensions 105a. In contrast thereto, the second lateral dimensions are significantly greater than twice the layer thickness 107 of the contact-making layer 103, so that it is ensured here that the depressions of the second lateral dimensions are not filled by the contact-making layer 103. This method functions both for normal depressions in the region of the structure size and for depressions that are configured to be very deep, that is to say distinctly deeper than the lateral dimension thereof.

It should furthermore be noted at this point that although a respective depression has two lateral dimensions, namely one in the X direction and one in the Y direction, exclusively the smallest of these two dimensions, that is to say the first lateral dimensions 105a, is in each case crucial for the classification of large and small depressions and thus for the classification of large and small contacts. Consequently, if a depression or a contact has at least a first lateral dimension of the order of magnitude such that twice the layer thickness of the contact-making layer is greater than the first lateral dimensions, then the depression is also filled during the application of the contact-making layer. In the other case where the two lateral dimensions are chosen such that twice the contact-making layer 103 is smaller than the second lateral dimensions, then these depressions are not filled.

Finally, in process step (C), according to the invention, the contact-making layer 103 is etched back in such a way that the contact-making layer 103 is preserved in the structures with the depressions which have the first lateral dimensions 105a of the order of magnitude of the structure depth 106 of the insulation layer 102, as shown in FIG. 1(a), while the contact-making layer 103 is removed in the structures with the depressions which have the second lateral dimensions 105b and 105c significantly greater than the structure depth 106 of the insulation layer 102, as shown in FIGS. 1(b) and 1(c), respectively.

It should be pointed out that, even in the event of an etching-back, depending on the etching process used, a remainder of the contact-making layer 103 may be preserved at the lateral side walls of the structures of the insulation layer 102, said remainder having rounded edges. The remainder of the contact-making layer 103 at the lateral walls of the insulation layer structure is negligible in comparison with the large lateral dimensions of the depressions in the case of the high-power through-plating elements and the terminal units.

Consequently, a contact-making layer 103 is afforded for the through-plating elements in accordance with FIG. 1(a), while the high-power through-plating elements and the terminal units in accordance with FIGS. 1(b) and 1(c) no longer have an intermediate layer formed in the form of a contact-making layer 103.

This results in the advantage that, on the one hand, the high-power through-plating elements have low-impedance properties and provide a good current-carrying capacity and that the terminal units (FIG. 1(c)) furthermore have a good bonding capability.

The method according to the invention makes it possible for through-plating elements, high-power through-plating elements and terminal units which have different lateral dimensions to be fabricated reliably and cost-effectively in one process sequence.

Figure 2B:
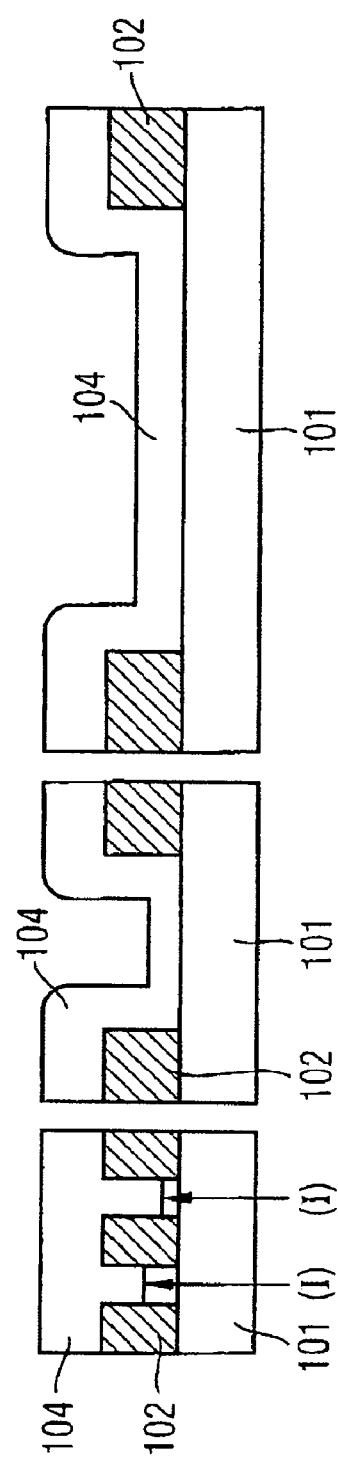
Figure 3A:
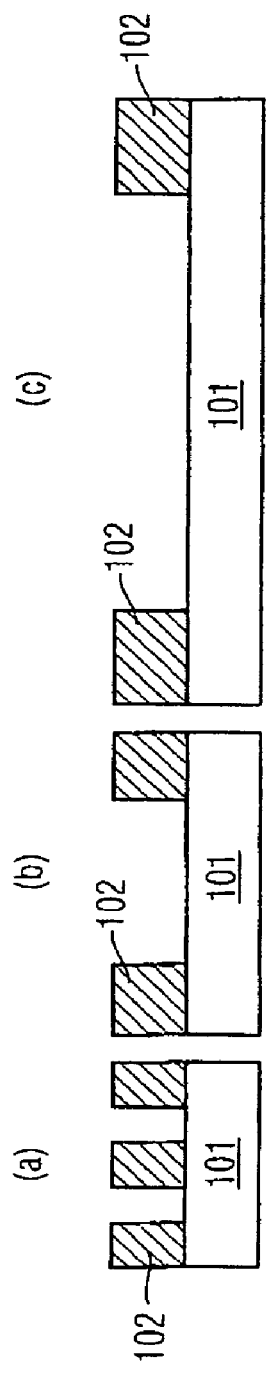
FIG. 3 shows tungsten deposition and a chemical mechanical polishing-back, in accordance with a further conventional method.
Figure 3B:
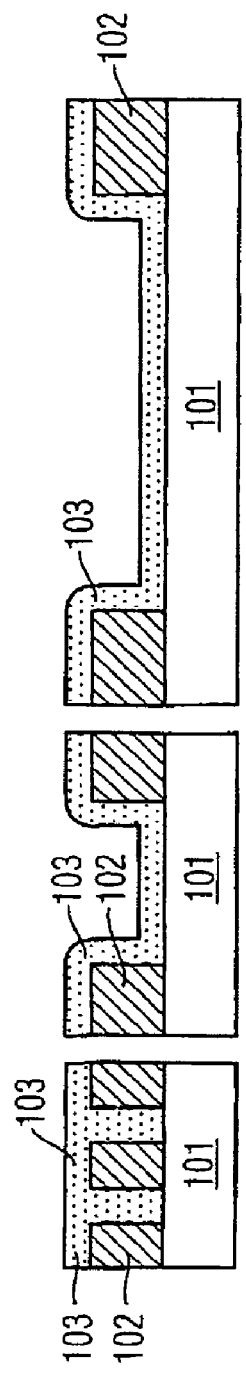
Figure 3C:
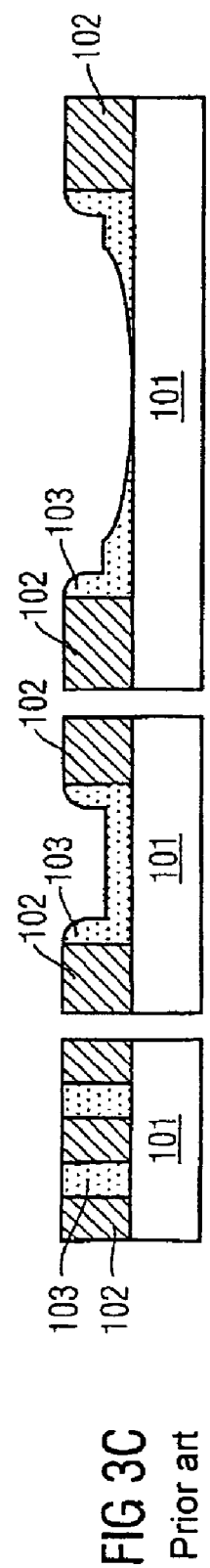
Figure 3D:
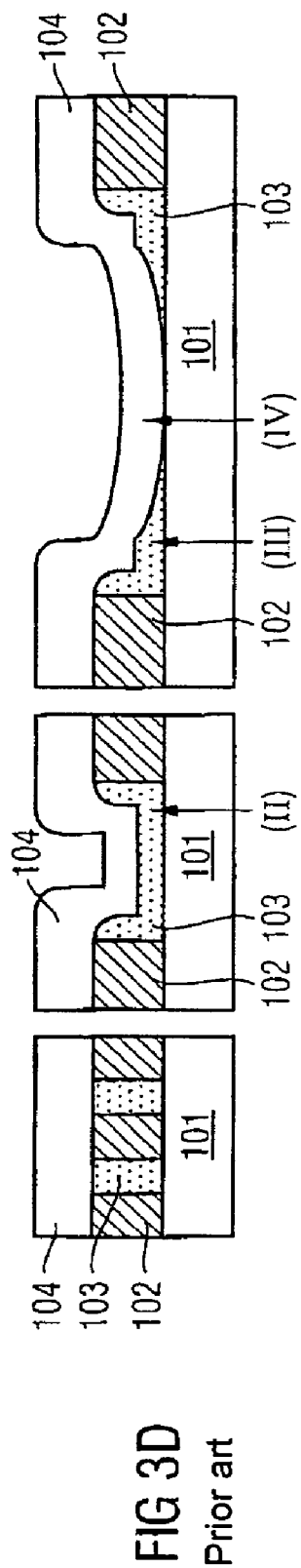
Figures 4A, 4B, 4C, 4D:
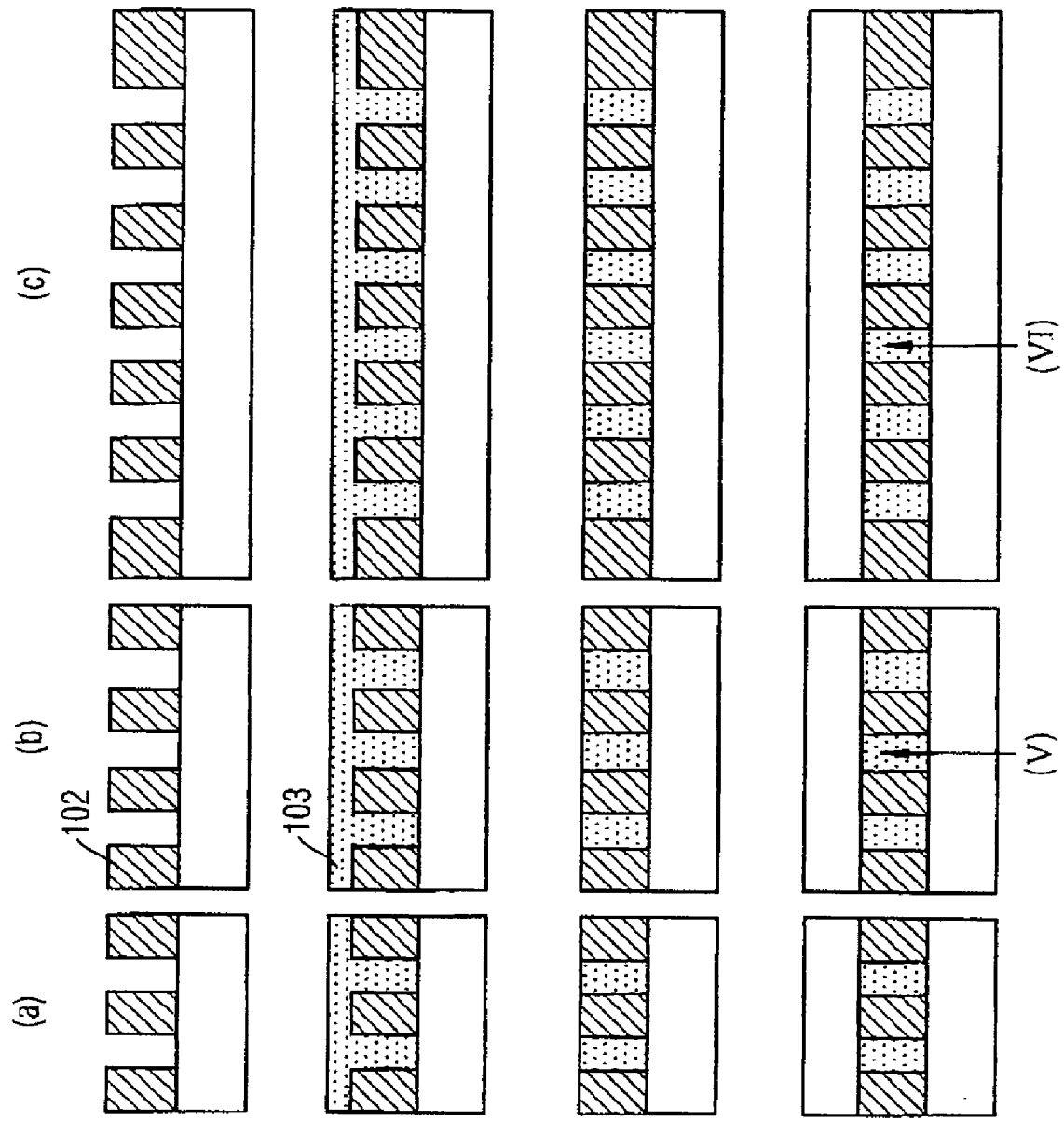
FIG. 4 shows tungsten deposition and a chemical mechanical polishing, in accordance with yet another conventional method.

With regard to the conventional methods described in FIGS. 2, 3 and 4, reference should be made to the introduction to the description.

Even though the present invention has been described above on the basis of preferred exemplary embodiments, it is not restricted thereto, but rather can be modified in diverse ways.

Moreover, the invention is not restricted to the application possibilities mentioned.

What is claimed is:

1. A method for fabricating an integrated circuit device, comprising:

a) providing an electrically conductive substrate;

b) depositing an insulation layer on the substrate;

c) etching depressions into the insulation layer which have a structure depth corresponding to a layer thickness of the insulation layer;
d) depositing a contact-making layer onto the patterned insulation layer and onto the substrate in the depressions, the depressions having first lateral dimensions which are less than a layer thickness of the contact-making layer and second lateral dimensions which are significantly greater than the layer thickness;
e) etching back the contact-making layer such that
   e1) the contact-making layer is preserved in the structures with the depressions which have the first lateral dimensions, and
   e2) the contact-making layer is removed in the structures with the depressions which have the second lateral dimensions; and
f) depositing a connecting layer on the substrate in the depressions which have the second lateral dimensions on the patterned insulation layer and on the etched-back contact-making layer which is included in the depressions having the first lateral dimensions.

2. The method according to claim 1, wherein, in (d), the contact-making layer is deposited such that the depressions which have the first lateral dimensions are filled to a higher level than the depressions which have the second lateral dimensions.

3. The method according to claim 1, wherein the substrate is provided as a first metal layer.

4. The method according to claim 1, wherein the insulation layer which is deposited on the substrate is formed as a silicon dioxide layer.

5. The method according to claim 1, wherein through-plating elements are formed in the structures of the insulation layer which have the depressions with the first lateral dimensions.

6. The method according to claim 1, wherein high-power through-plating elements having a high current-carrying capacity and/or a low resistance are formed in the structures of the insulation layer which have the depressions with the second lateral dimensions.

7. The method according to claim 1, wherein terminal units that provide for external components to make contact with the integrated circuit device are formed in the structures of the insulation layer which have the depressions with the second lateral dimensions.

8. The method according to claim 7, wherein the terminal units formed in the structures of the insulation layer which have the depressions with the second lateral dimensions are bonded.

9. The method according to claim 1, wherein the contact-making layer is fabricated on the patterned insulation layer and on the substrate in the depressions which have the first and second lateral dimensions, by deposition of tungsten material by means of chemical vapor deposition.

10. The method according to claim 1, wherein the connecting layer is provided as a second metal layer.

11. The method according to claim 3, wherein the first and second metal layers are provided from the same material.

12. The method according to claim 3, wherein the first and/or the second metal layer are formed from an aluminum material.

13. An integrated circuit device, where fabrication of the intergrated circuit decice comprises:
a) providing an electrically conductive substrate;
b) depositing an insulation layer on the substrate;
c) etching depressions into the insulation layer which have a structure depth corresponding to a layer thickness of the insulation layer;
d) depositing a contact-making layer onto the patterned insulation layer and onto the substrate in the depressions, the depressions having first lateral dimensions which are less than a layer thickness of the contact-making layer and second lateral dimensions which are significantly greater than the layer thickness;
e) etching back the contact-making layer such that
   e1) the contact-making layer is preserved in the structures with the depressions which have the first lateral dimensions, and
   e2) the contact-making layer is removed in the structures with the depressions which have the second lateral dimensions; and
f) depositing a connecting layer on the substrate in the depressions which have the second lateral dimensions on the patterned insulation layer and on the etched-back contact-making layer which is included in the depressions having the first lateral dimensions.

* * * * *